United States Patent
Kawamura et al.

(10) Patent No.: US 11,028,269 B2
(45) Date of Patent: Jun. 8, 2021

(54) SILICONE-MODIFIED EPOXY RESIN COMPOSITION AND SEMICONDUCTOR DEVICE

(71) Applicant: Shin-Etsu Chemical Co., Ltd., Tokyo (JP)

(72) Inventors: Norifumi Kawamura, Annaka (JP); Shoichi Osada, Annaka (JP); Kohei Otake, Annaka (JP)

(73) Assignee: SHIN-ETSU CHEMICAL CO., LTD, Tokyo (JP)

( * ) Notice: Subject to any disclaimer, the term of this patent is extended or adjusted under 35 U.S.C. 154(b) by 33 days.

(21) Appl. No.: 15/971,019

(22) Filed: May 4, 2018

(65) Prior Publication Data

US 2018/0334567 A1 Nov. 22, 2018

(30) Foreign Application Priority Data

May 19, 2017 (JP) .............................. JP2017-099972
May 19, 2017 (JP) .............................. JP2017-100000

(51) Int. Cl.
| | |
|---|---|
| *C08L 83/06* | (2006.01) |
| *H01L 33/56* | (2010.01) |
| *H01L 23/29* | (2006.01) |
| *C08L 83/10* | (2006.01) |
| *C08K 5/00* | (2006.01) |
| *C08G 59/14* | (2006.01) |
| *C08G 59/40* | (2006.01) |
| *C08G 59/32* | (2006.01) |
| *C08G 59/62* | (2006.01) |
| *C08G 59/30* | (2006.01) |
| *C08G 77/42* | (2006.01) |
| *C08G 77/00* | (2006.01) |
| *C08G 77/14* | (2006.01) |
| *C08G 77/38* | (2006.01) |
| *C08G 77/388* | (2006.01) |

(52) U.S. Cl.
CPC .......... *C08L 83/06* (2013.01); *C08G 59/1433* (2013.01); *C08G 59/1494* (2013.01); *C08G 59/306* (2013.01); *C08G 59/3281* (2013.01); *C08G 59/4028* (2013.01); *C08G 59/4085* (2013.01); *C08G 59/62* (2013.01); *C08K 5/0041* (2013.01); *C08L 83/10* (2013.01); *H01L 23/296* (2013.01); *H01L 33/56* (2013.01); *C08G 77/14* (2013.01); *C08G 77/38* (2013.01); *C08G 77/388* (2013.01); *C08G 77/42* (2013.01); *C08G 77/80* (2013.01); *C08L 2203/20* (2013.01)

(58) Field of Classification Search
CPC ............ C08L 83/04; C08L 83/06; C08K 3/04
See application file for complete search history.

(56) References Cited

U.S. PATENT DOCUMENTS

| | | | |
|---|---|---|---|
| 9,633,921 B2 | 4/2017 | Osada et al. | |
| 2010/0140537 A1* | 6/2010 | Morita | C08L 83/04 252/78.3 |
| 2010/0213623 A1 | 8/2010 | Isshiki et al. | |
| 2019/0144704 A1* | 5/2019 | Kawamura | C09D 163/00 523/435 |

FOREIGN PATENT DOCUMENTS

| | | | |
|---|---|---|---|
| EP | 2083038 A1 | * | 7/2009 |
| JP | S63-199220 A | | 8/1988 |
| JP | 03-234778 | * | 10/1991 |
| JP | 06-15603 B2 | | 3/1994 |
| JP | 2005-213299 A | | 8/2005 |
| JP | 2007-224146 A | | 9/2007 |
| JP | 2008-143950 A | | 6/2008 |
| JP | 2010-031126 A | | 2/2010 |
| JP | 2013-053218 A | | 3/2013 |
| JP | 2013-203865 A | | 10/2013 |
| JP | 2016-003299 | * | 1/2016 |
| JP | 2016-210907 A | | 12/2016 |

OTHER PUBLICATIONS

Machine translation of JP 2016-003299 (no date).*
Japanese Office Action dated Jan. 26, 2021 for JP Application No. 2017-099972 with English Abstract.

* cited by examiner

*Primary Examiner* — Marc S Zimmer
(74) *Attorney, Agent, or Firm* — Birch, Stewart, Kolasch & Birch, LLP

(57) ABSTRACT

The invention provides a resin composition comprising a specific silicone-modified epoxy resin, a specific silicone-modified phenolic resin, black pigment, and an inorganic filler. The invention also provides a resin composition comprising a specific cyanate ester compound, a specific silicone-modified epoxy resin, and a specific phenol compound and/or silicone-modified phenolic resin.

3 Claims, 1 Drawing Sheet

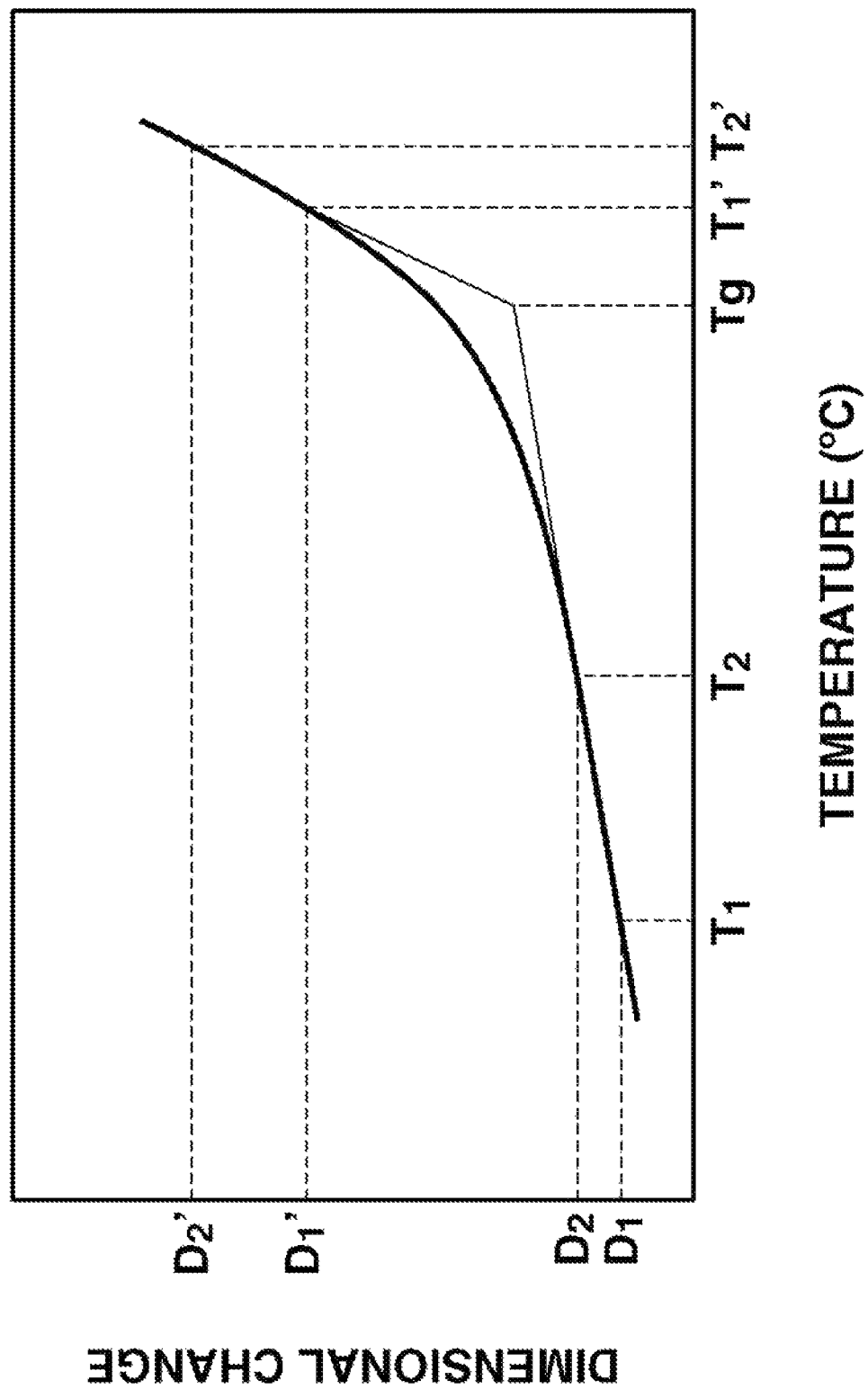

SILICONE-MODIFIED EPOXY RESIN COMPOSITION AND SEMICONDUCTOR DEVICE

CROSS-REFERENCE TO RELATED APPLICATION

This non-provisional application claims priority under 35 U.S.C. § 119(a) on Patent Application Nos. 2017-099972 and 2017-100000 filed in Japan on May 19, 2017 and May 19, 2017, respectively, the entire contents of which are hereby incorporated by reference.

TECHNICAL FIELD

This invention relates to a silicone-modified epoxy resin composition having improved tracking resistance, a silicone-modified epoxy resin composition having a reduced modulus and the suppressed risk of cracks and separation while maintaining thermal stability and temperature/humidity resistance, and a semiconductor device encapsulated with a cured product of the resin composition.

BACKGROUND ART

The current mainstream of semiconductor devices including diodes, transistors, ICs, and LSIs is of the resin encapsulation type. Epoxy resins have superior moldability, adhesion, electrical properties, mechanical properties, and moisture resistance to other thermosetting resins. It is thus widely spread to encapsulate semiconductor devices with epoxy resin compositions. Over the decade, the electronic equipment market is under the increasing trend toward compact size, light weight and high performance of semiconductor devices and high integration of semiconductor chips. Since the spacing between interconnects or wires within the semiconductor is accordingly reduced, the resin composition is required to have higher reliability.

As a result of reduction of size and profile, the width of circuit pitch and the distance between lead terminals are reduced. This makes it difficult to secure a space distance and creepage distance sufficient to provide electric insulation therebetween. For the encapsulant as the insulator, improvements in performance, especially tracking resistance are required.

In the prior art, several means for enhancing tracking resistance of encapsulants such as epoxy resin compositions are known. For example, Patent Document 1 proposes to increase the amount of inorganic filler blended, Patent Document 2 describes to blend a small amount of silicone rubber powder in addition to an inorganic filler, Patent Document 3 discloses a mixture of an alicyclic epoxy resin having a cyclohexane polyether skeleton, but free of a benzene skeleton susceptible to formation of conductive paths and a dicyclopentadiene type phenolic resin, and Patent Document 4 describes the use of an aminotriazine-modified novolak resin or melamine resin as curing agent. On the other hand, the progress is toward semiconductor chips of thin profile and wires of reduced size, suggesting that flow during molding is an important factor. Increasing the amount of inorganic filler blended is effective for the purpose of enhancing tracking resistance at the sacrifice of flow during molding. Also, while aromatic moiety makes a substantial contribution to the heat resistance of resin compositions, non-aromatic epoxy resins invite a lowering of heat resistance, giving detrimental impact on reliability.

In the decade, the semiconductor devices encounter outstanding technical innovations. For example, the through-silicon-via (TSV) technology is used in mobile information/communication terminals such as smart phones and tablets so that a large volume of data may be processed at a higher speed. In this technology, semiconductor chips are connected in multiple layers, and flip-chip connected to silicon interposers of 8 to 12 inches. Thereafter, the silicon interposers having a plurality of multilayer connected semiconductor chips mounted thereon are encapsulated with a thermosetting resin. The unnecessary resin on the semiconductor chips is polished away, followed by singulation into semiconductor devices with advantages of small size, thin profile, multi-function, and high-speed-processing. However, when encapsulation is made by coating the thermosetting resin on the entire surface of a thin silicon interposer of 8 to 12 inches, substantial warpage occurs due to the difference in coefficient of thermal expansion between the silicon and the thermosetting resin. The substantial warpage poses an outstanding technical problem because of prohibited transfer to the subsequent polishing and singulation steps.

Also over the decades, the environmental countermeasures on the global level as typified by the energy conversion from fossil fuel are on progress. In the automobile field, for example, the number of hybrid cars and electric vehicles manufactured is increasing. In emerging countries including China and India, an increasing number of household electric equipment having inverter motors mounted therein as the energy saving countermeasure are marketed.

For hybrid cars, electric vehicles, and inverter motors, power semiconductor devices for AC/DC or DC/AC conversion and voltage transformation are important. Although silicon (Si) has long been used as the semiconductor, the silicon technology approaches its performance limit. For example, it becomes rather difficult to expect an outstanding performance improvement such as a reduction of the resistance of power MOSFET for the purpose of reducing the power loss during power transformation. Attention is now paid to power semiconductor devices of the next generation using wide bandgap semiconductors such as silicon carbide (SiC), gallium nitride (GaN) and diamond. Among others, the development of low-loss power MOSFETs using SiC is advancing.

The wide-gap semiconductors including SiC and GaN have excellent characteristics as demonstrated by a bandgap of about 3 folds and a breakdown field strength of at least 10 folds greater than Si. Also reported are such characteristics as high-temperature operation (operation at 650° C. is reported for SiC), high thermal conductivity (SiC is equivalent to Cu), and a high saturation electron drift velocity. By virtue of these characteristics, the use of SiC or GaN enables to reduce the ON resistance of power semiconductor devices and to substantially save the power loss of power conversion circuits.

Power semiconductor devices are generally protected by transfer molding of epoxy resin or potting encapsulation of silicone gel. Recently, from the standpoint of size and weight reduction (particularly in the automobile application), transfer molding of epoxy resin becomes the mainstream. Although the epoxy resin is a thermosetting resin having a good balance of moldability, substrate adhesion and mechanical strength, it undergoes pyrolysis of crosslinking points at temperatures in excess of 200° C. This prohibits the use of epoxy resin as the encapsulant in the high-temperature environment in which operation of SiC and GaN devices is expected.

Then, thermosetting resin compositions containing cyanate resins are studied as the material having improved thermal properties. Among the materials having improved thermal properties, the cyanate resins have a very low coefficient of thermal expansion and are effective for suppressing shrinkage stress during encapsulation and curing. Even when large diameter or thin profile wafers or large-size metal or other substrates are encapsulated, the cyanate resins are effective for suppressing the warpage of wafers or substrates.

For example, Patent Document 5 describes that stable heat resistance is achieved by reacting a polyfunctional cyanate ester with an epoxy resin to form an oxazole ring in a cured product of a phenol novolak resin. It is described therein that a cured product having improved heat resistance and water resistance is obtained when the equivalent amount of hydroxyl groups in the phenol novolak resin is 0.4 to 1.0 and the equivalent amount of cyanato groups in the polyfunctional cyanate ester is 0.1 to 0.6 per equivalent of epoxy groups in the epoxy resin. This composition, however, suffers from poor mass productivity because the reaction of epoxy groups with cyanato groups to form an oxazole ring requires a high temperature/long term heat curing step.

Patent Document 6 describes that a thermosetting resin composition comprising a cyanate ester compound of specific structure, a phenol compound, and an inorganic filler has improved heat resistance and high mechanical strength. Because of insufficient humidity resistance, the composition has the problem that peeling and cracking occur when it is held in a hot humid environment for a long term.

Patent Document 7 describes that a cured product having improved thermal stability and temperature/humidity resistance is obtained from a composition comprising a cyanate ester compound, a phenol compound, and an epoxy resin of specific structure wherein a proportion of the phenol compound relative to the cyanate ester compound and a proportion of the epoxy resin relative to the cyanate ester compound are controlled to specific ranges. However, this resin composition has a high modulus and is insufficient in suppressing separation at the interface between a chip-mounted surface of a substrate and the cured product of the resin composition.

Since cracking in packages and separation at the interface between a chip-mounted substrate surface and a cured resin composition are considered problems, stress lowering, that is, reducing the modulus of a cured product is desired as the means for preventing these problems.

CITATION LIST

Patent Document 1: JP-A 2008-143950
Patent Document 2: JP-A 2013-203865
Patent Document 3: JP-A 2005-213299
Patent Document 4: JP-A 2010-031126
Patent Document 5: JP-B H06-15603
Patent Document 6: JP-A 2013-053218
Patent Document 7: JP-A 2016-210907

DISCLOSURE OF INVENTION

An object of the invention is to provide a silicone-modified epoxy resin composition having improved tracking resistance and a semiconductor device encapsulated with the resin composition. Another object is to provide a silicone-modified epoxy resin composition having a reduced modulus and suppressed cracking and separation while maintaining thermal stability and temperature/humidity resistance, and a semiconductor device.

The inventors have found that the outstanding problems are solved by a silicone-modified epoxy resin composition comprising a specific silicone-modified epoxy resin, a specific silicone-modified phenolic resin, a black pigment, and an inorganic filler.

A first embodiment of the invention is a silicone-modified epoxy resin composition comprising:

(A) a silicone-modified epoxy resin obtained from hydrosilylation reaction of an alkenyl-containing epoxy compound with an organopolysiloxane having the average compositional formula (1):

$$H_a R_b SiO_{4-a-b)/2} \quad (1)$$

wherein R is each independently a $C_1$-$C_{10}$ monovalent hydrocarbon group, a is a positive number: $0.01 \le a \le 1$, b is a positive number: $1 \le b \le 3$, meeting $1.01 \le a+b < 4$, (B) a silicone-modified phenolic resin obtained from hydrosilylation reaction of an alkenyl-containing phenol compound with an organopolysiloxane having the average compositional formula (1), (C) a black pigment, and (D) an inorganic filler exclusive of the black pigment (C).

In a preferred embodiment, the organopolysiloxane in components (A) and (B) is at least one member selected from compounds having, the formulae (a), (b) and (c):

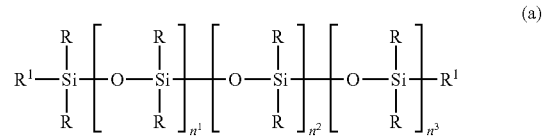

wherein R is as defined above, $R^1$ is hydrogen or a group as defined for R, $n^1$ is an integer of 0 to 200, $n^2$ is an integer of 0 to 2, $n^3$ is an integer of 0 to 10, with the proviso that $n^1$, $n^2$ and $n^3$ are not equal to 0 at the same time, and $R^2$ is a group having the formula (a'):

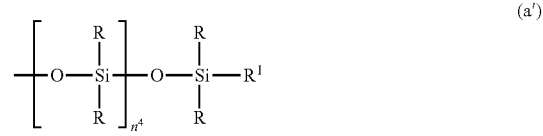

wherein R and $R^1$ are as defined above, $n^4$ is an integer of 1 to 10, siloxane units each in brackets may be randomly bonded or form blocks, the compound of formula (a) containing at least one silicon-bonded hydrogen per molecule,

wherein R is as defined above, $n^5$ is an integer of 0 to 10, $n^6$ is an integer of 1 to 4, meeting $3 \le n^5+n^6 \le 12$, the arrangement of siloxane units each in brackets is not limited,

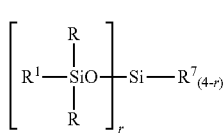

(c)

wherein R and $R^1$ are as defined above, r is an integer of 0 to 3, and $R^7$ is hydrogen or a $C_1$-$C_{10}$ organic group, the compound of formula (c) containing at least one silicon-bonded hydrogen per molecule.

In a preferred embodiment, the alkenyl-containing phenol compound in component (B) has the following formula.

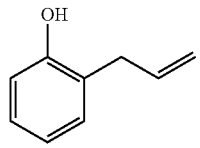

In a preferred embodiment, the inorganic filler (D) is present in an amount of 150 to 1,500 parts by weight per 100 parts by weight of components (A) and (B) combined and 60 to 94% by weight of the total weight of the composition.

Also contemplated herein is a semiconductor device encapsulated with a cured product of the silicone-modified epoxy resin composition defined above.

The inventors have also found that a resin composition comprising a specific cyanate ester compound, a specific silicone-modified epoxy resin, and a specific phenol compound and/or silicone-modified phenolic resin, wherein a proportion of the phenol compound relative to the cyanate ester compound and a proportion of the epoxy resin relative to the cyanate ester compound are controlled to specific ranges is reduced in modulus while maintaining thermal stability and thus effective for suppressing cracks and separation.

A second embodiment of the invention is a silicone-modified epoxy resin composition comprising:

(P) a cyanate ester compound having at least two cyanato groups per molecule, (A) a silicone-modified epoxy resin obtained from hydrosilylation reaction of an alkenyl-containing epoxy compound with an organopolysiloxane having the average compositional formula (1):

$$H_aR_bSiO_{(4-a-b)/2} \tag{1}$$

wherein R, a, and b are as defined above, and (F) a phenol compound having at least two phenolic hydroxyl groups per molecule and/or a silicone-modified phenolic resin obtained from hydrosilylation reaction of an alkenyl-containing phenol compound with an organopolysiloxane having the average compositional formula (1), wherein a molar ratio of epoxy groups in the epoxy resin (A) to cyanato groups in the cyanate ester compound (P) is in the range of 0.04 to 0.30, and a molar ratio of phenolic hydroxyl groups in the phenol compound (F) to cyanato groups in the cyanate ester compound (P) is in the range of 0.08 to 0.30.

In a preferred embodiment, component (P) is a compound having the general formula (2):

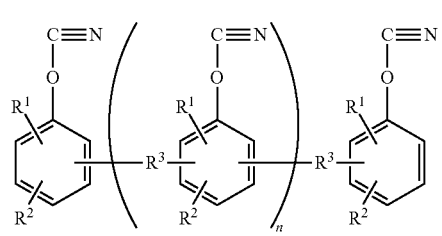

wherein $R^1$ and $R^2$ are each independently hydrogen or $C_1$-$C_4$ alkyl, $R^3$ is each independently a divalent group selected from the following formulae:

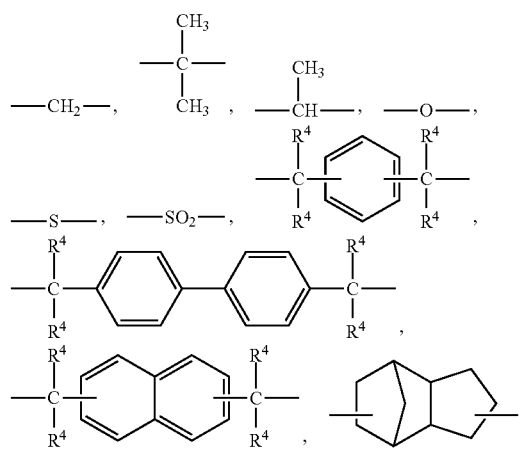

wherein $R^4$ is each independently hydrogen or methyl, and n is an integer of 0 to 10.

In a preferred embodiment, the organopolysiloxane in components (A) and (F) is at least one member selected from compounds having the formulae (a), (b) and (c) defined above.

In a preferred embodiment, the alkenyl-containing phenol compound in component (F) has the following formula.

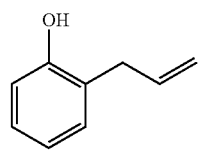

Also contemplated herein is a semiconductor device encapsulated with a cured product of the silicone-modified epoxy resin composition defined above.

Advantageous Effects of Invention

The resin composition in the first embodiment of the invention is advantageous in that using a specific silicone-modified epoxy resin and a specific silicone-modified phenolic resin as curing agent, formation of carbide conductive paths which can cause short-circuiting is suppressed and tracking resistance is enhanced. The resin composition in the second embodiment of the invention is advantageous in that using a specific silicone-modified epoxy resin and a specific phenol compound and/or silicone-modified phenolic resin as curing agent, the modulus is reduced and the risk of cracking or separation is suppressed while maintaining thermal stability and temperature/humidity resistance.

BRIEF DESCRIPTION OF DRAWINGS

The only figure, FIG. 1 is a diagram for illustrating how to determine the Tg of resin compositions of Examples 4 to 7 and Comparative Examples 4, 5 in the second embodiment of the invention.

DESCRIPTION OF PREFERRED EMBODIMENTS

The notation (Cn-Cm) means a group containing from n to m carbon atoms per group.

First Embodiment

The first embodiment of the invention is a resin composition comprising:
(A) a silicone-modified epoxy resin obtained from hydrosilylation reaction of an alkenyl-containing epoxy compound with an organopolysiloxane having the average compositional formula (1),
(B) a silicone-modified phenolic resin obtained from hydrosilylation reaction of an alkenyl-containing phenol compound with an organopolysiloxane having the average compositional formula (1),
(C) a black pigment, and
(D) an inorganic filler exclusive of the black pigment (C).
(A) Silicone-Modified Epoxy Resin Component (A) is a copolymer obtained from hydrosilylation reaction of an alkenyl-containing epoxy compound with a hydrogenorganopolysiloxane having the average compositional formula (1). The inclusion of the copolymer ensures that the resin composition of the first embodiment has high heat resistance, hygroscopicity, tracking resistance, and flow.

The alkenyl-containing epoxy compound used herein is not particularly limited as long as it has epoxy and alkenyl groups and is generally used in semiconductor encapsulating resin compositions.

Suitable epoxy resins include cresol novolak type epoxy resins, biphenyl type epoxy resins, dicyclopentadiene-modified phenol type epoxy resins, biphenyl aralkyl type epoxy resins, triphenylalkane type epoxy resins, naphthol type epoxy resins, triazine derivative epoxy resins, and epoxycyclohexyl type epoxy resins. Such epoxy resins further having alkenyl groups such as vinyl or allyl are useful.

Of the foregoing epoxy compounds, compounds of the following structural formulae are preferred because of effective working and tracking resistance.

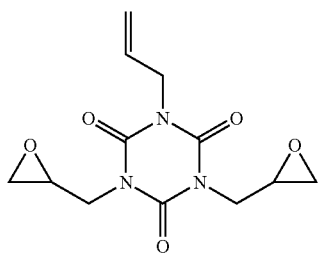

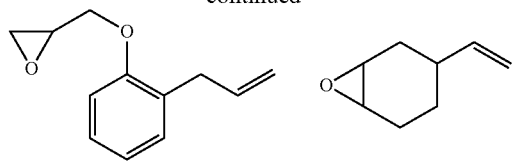

The hydrogenorganopolysiloxane has the average compositional formula (1):

$$H_a R_b SiO_{(4-a-b)/2} \quad (1)$$

wherein R is each independently a $C_1$-$C_{10}$ monovalent hydrocarbon group, a is a positive number: $0.01 \leq a \leq 1$, b is a positive number: $1 \leq b \leq 3$, meeting $1.01 \leq a+b < 4$.

Specifically, the hydrogenorganopolysiloxane of formula (1) has at least one SiH group, preferably 2 to 10 SiH groups per molecule. In formula (I), R is a $C_1$-$C_{10}$, preferably $C_1$-$C_6$, monovalent hydrocarbon group, examples of which include alkyl groups such as methyl, ethyl, propyl, isopropyl, butyl, isobutyl, tert-butyl, pentyl, neopentyl, hexyl, octyl, nonyl, and decyl, aryl groups such as phenyl, tolyl, xylyl and naphthyl, and aralkyl groups such as benzyl, phenylethyl, and phenylpropyl. Inter alia, methyl, ethyl and phenyl are preferred. Also useful are substituted forms of the hydrocarbon groups in which some hydrogen is substituted by halogen such as fluorine, bromine or chlorine.

The organopolysiloxane having the average compositional formula (1) may be linear, cyclic or branched. For example, those having the following formulae (a), (b) and (c) are included.

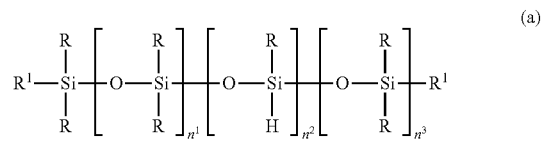

In formula (a), R is as defined above, $R^1$ is hydrogen or a group as defined for R, and $R^2$ is a group having the formula (a').

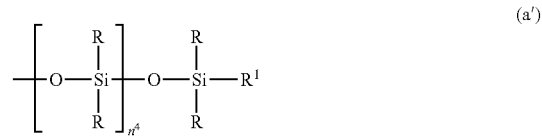

In formula (a'), R and $R^1$ are as defined above, $n^4$ is an integer of 0 to 10, preferably 0 to 2.

In formula (a), $n^1$ is an integer of 0 to 200, preferably 0 to 20; $n^2$ is an integer of 0 to 2, preferably 0 or 1; $n^3$ is an integer of 0 to 10, preferably 0 to 6; with the proviso that $n^1$, $n^2$ and $n^3$ are not equal to 0 at the same time. Notably, siloxane units each in brackets [ ] may be randomly bonded or form blocks. The compound of formula (a) contains at least one silicon-bonded hydrogen (SiH group) per molecule, preferably 2 to 10 SiH groups per molecule. Then in formula (a) wherein $n^2=0$, at least one $R^1$ in formulae (a) and (a') is hydrogen.

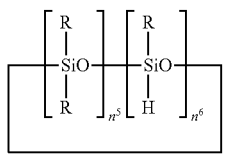
(b)

In formula (b), R is as defined above, $n^5$ is an integer of 0 to 10, preferably 0 to 6, $n^6$ is an integer of 1 to 4, preferably 2 to 4, meeting $3 \leq n^5+n^6 \leq 12$. The arrangement of siloxane units each in brackets is not limited.

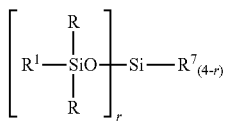
(c)

In formula (c), R and $R^1$ are as defined above, r is an integer of 0 to 3, and $R^7$ is hydrogen or a $C_1$-$C_{10}$, preferably $C_1$-$C_6$ organic group, typically monovalent hydrocarbon group. The compound of formula (c) contains at least one silicon-bonded hydrogen per molecule. Then in formula (c) wherein r=0, at least one $R^1$ is hydrogen.

Examples of the group $R^7$ include hydrogen, alkyl groups such as methyl, ethyl, propyl, isopropyl, butyl, isobutyl, tert-butyl, pentyl, neopentyl, hexyl, octyl, nonyl, and decyl, alkoxy groups such as methoxy, ethoxy, propoxy, isopropoxy, butoxy, isobutoxy, and tert-butoxy, aryl groups such as phenyl, tolyl, xylyl and naphthyl, and aralkyl groups such as benzyl, phenylethyl, and phenylpropyl. Inter alia, hydrogen, methyl and phenyl are preferred.

Of the hydrogenorganopolysiloxanes, both end hydrogenmethylpolysiloxanes and both end hydrogenmethylphenylpolysiloxanes are preferred. For example, the compounds shown below are preferred.

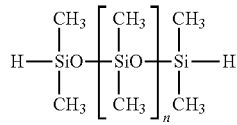

Herein n is an integer of 1 to 100.

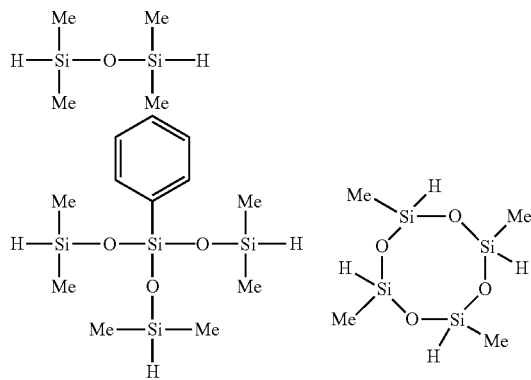

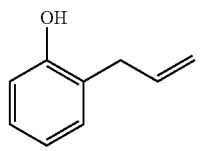

The hydrosilylation reaction for forming the silicone-modified epoxy resin as component (A) may accord with any prior art well-known techniques. For example, the reaction may be carried out by heating in the presence of a platinum base catalyst such as chloroplatinic acid. The hydrosilylation reaction is typically carried out in an inert solvent such as benzene or toluene at an elevated temperature of 60 to 120° C. A proportion of the epoxy compound and the polysiloxane is such that the number of SiH groups on the polysiloxane per alkenyl group on the epoxy compound may be at least 1.0, preferably 1.5 to 5.0.

(B) Silicone-Modified Phenolic Resin

Component (B) is a silicone-modified phenolic resin serving as a curing agent by reacting with epoxy groups. It is a copolymer obtained from hydrosilylation reaction of an alkenyl-containing phenol compound with an organopolysiloxane having the average compositional formula (1) defined above. The inclusion of the copolymer ensures that the resin composition of the first embodiment has high heat resistance, hygroscopicity, tracking resistance, and flow.

The alkenyl-containing phenol compound used herein is not particularly limited as long as it has phenolic hydroxyl and alkenyl groups and is generally used in semiconductor encapsulating resin compositions. Suitable phenolic resin base curing agents include phenol novolak resins, cresol novolak resins, phenol aralkyl resins, biphenyl aralkyl resins, bisphenol A type resins, bisphenol F type resins, dicyclopentadiene type phenolic resins, silicone-modified phenolic resins, and triphenolalkane type resins. Such phenolic resins further having alkenyl groups such as vinyl or allyl are useful.

Of the phenol compounds, the compound of the following structural formula is preferred because of effective working and tracking resistance.

The hydrogenorganopolysiloxane to be reacted with the alkenyl-containing phenol compound may be of the same structure as exemplified for the polysiloxane used in component (A).

The hydrosilylation reaction for forming the silicone-modified phenolic resin as component (B) may accord with any prior art well-known techniques. For example, the reaction may be carried out by heating in the presence of a platinum base catalyst such as chloroplatinic acid. The hydrosilylation reaction is typically carried out in an inert solvent such as benzene or toluene at an elevated temperature of 60 to 120° C. A proportion of the phenol compound and the polysiloxane is such that the number of SiH groups on the polysiloxane per alkenyl group on the phenol compound may be at least 1.0, preferably 1.5 to 5.0.

The silicone-modified epoxy resin (A) as base and the silicone-modified phenolic resin (B) as curing agent are preferably combined such that a ratio of epoxy groups to phenolic hydroxyl groups ranges from 0.6/1 to 1.6/1, more preferably from 0.8 to 1.3.

(C) Black Pigment

Component (C) is a black pigment for coloring the resin composition black. Examples of the pigment used herein include, but are not limited to, carbon black, furnace black and acetylene black as used in conventional encapsulating resin compositions. Inter alia, carbon black is preferred. Now that the resin composition is colored black, semiconductor devices fabricated using the composition as semiconductor encapsulant are given satisfactory outer appearance and laser marking performance comparable to those of semiconductor devices encapsulated with prior art epoxy resin compositions.

The pigment is blended in an amount of preferably at least 1 part by weight, more preferably at least 3 parts by weight per 100 parts by weight of the total of resin components, i.e., components (A) and (B) in the resin composition. At least 1 pbw of the pigment is preferred in that luster does not become too high, the outer appearance fault that a trace of a semiconductor chip reflects on the semiconductor package surface is avoided, the color is fully black, and laser marking performance is satisfactory. The amount of the pigment is preferably up to 10 parts by weight.

(D) Inorganic Filler

Component (D) is an inorganic filler. Suitable fillers include silicas such as fused silica, crystalline silica, and cristobalite, as well as alumina, silicon nitride, aluminum nitride, boron nitride, titanium oxide, glass fibers, magnesium oxide, and zinc oxide. Notably, the black pigment as component (C) is excluded.

Although the inorganic filler is not particularly limited in size and shape, the filler preferably has an average particle size of 1 to 50 μm, more preferably 4 to 20 μm. It is noted that the average particle size is a value of laser diffraction particle size distribution measurement such as by Cilas®.

The inorganic filler preferably has a chloride ion content of up to 10 ppm, more preferably up to 5 ppm and a sodium ion content of up to 10 ppm, more preferably up to 5 ppm, when impurities are extracted from the filler in a concentration of sample 10 g/water 50 g under conditions: 125° C., 2.1 atm., and 20 hours. As long as the impurity content is within the range, there is no risk that the semiconductor device encapsulated with the filled composition undergoes a decline of humidity resistance.

The inorganic filler is blended in an amount of preferably 150 to 1,500 parts by weight, more preferably 250 to 1,200 parts by weight per 100 parts by weight of the total of components (A) and (B). Also preferably the inorganic filler accounts for 60 to 94% by weight, more preferably 70 to 92% by weight, even more preferably 75 to 90% by weight of the total weight of the resin composition.

Prior to use, the inorganic filler is preferably surface treated with coupling agents for enhancing the bond strength between the resin component and the filler. Suitable coupling agents are silane coupling agents and titanate coupling agents. Preferred are silane coupling agents including epoxy silanes such as γ-glycidoxypropyltrimethoxysilane, γ-glycidoxypropylmethyldiethoxysilane, β-(3,4-epoxycyclohexyl) ethyltrimethoxysilane; N-β-(aminoethyl)-γ-aminopropyltrimethoxysilane, the reaction product of imidazole with γ-glycidoxypropyltrimethoxysilane; aminosilanes such as γ-aminopropyltriethoxysilane, N-phenyl-γ-aminopropyltrimethoxysilane; mercaptosilanes such as γ-mercaptosilane and γ-episulfidoxypropyltrimethoxysilane. The amount of the coupling agent used and the surface treatment mode are not particularly limited and may accord with the standard technology.

Second Embodiment

The second embodiment of the invention is a resin composition comprising:

(P) a cyanate ester compound having at least two cyanato groups per molecule, (A) a silicone-modified epoxy resin obtained from hydrosilylation reaction of an alkenyl-containing epoxy compound with an organopolysiloxane having the average compositional formula (1), and (F) a phenol compound having at least two phenolic hydroxyl groups per molecule and/or a silicone-modified phenolic resin obtained from hydrosilylation reaction of an alkenyl-containing phenol compound with an organopolysiloxane having the average compositional formula (1).

(P) Cyanate Ester Compound

Component (P) is a cyanate ester compound having at least two cyanato groups per molecule. Any well-known cyanate may be used as long as it has at least two cyanato groups per molecule. For example, cyanate ester compounds having the general formula to (2) are useful.

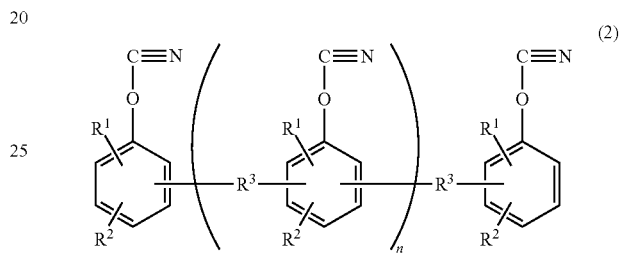

Herein $R^1$ and $R^2$ are each independently hydrogen or $C_1$-$C_4$ alkyl, $R^3$ is each independently a divalent group selected from the following formulae:

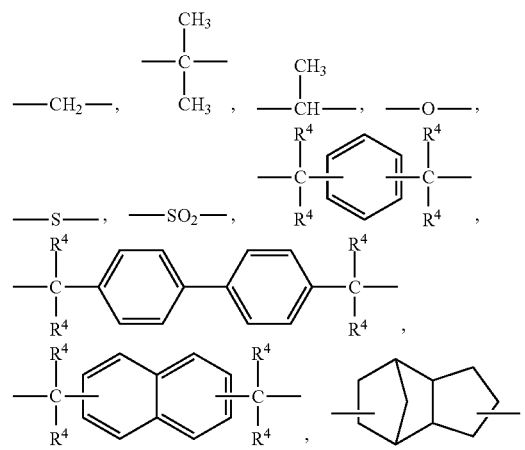

wherein $R^4$ is each independently hydrogen or methyl, and n is an integer of 0 to 10.

Examples of the cyanate ester compound (P) include bis(4-cyanatophenyl)methane, bis(3-methyl-4-eyanatophenyl)methane, bis(3-ethyl-4-cyanatophenyl)methane, bis(3, 5-dimethyl-4-cyanatophenypmethane, 1,1-bis(4-cyanotophenyl)ethane, 2,2-bis(4-cyanotophenyl)propane, 2,2-bis(4-cyanotophenyl)-1,1,1,3,3,3-hexafluoropropane, di(4-cyanotophenyl)thioether, 1,3-dicyanatobenzene, 1,4-dicyanatobenzene, 2-tert-butyl-1,4-dicyanatobenzene, 2,4-dimethyl-1,3-dicyanatobenzene, 2,5-di-tort-butyl-1,4-dicyanatobenzene, tetramethyl-1,4-dieyanatobenzene, 1,3, 5-tricyanatobenzene, 2,2'-dicyanatobiphenyl, 4,4'-dicyanatobiphenyl, 3,3',5,5'-tetramethyl-4,4'- dicyanatobiphenyl, 1,3-dicyanatonaphthalene, 1,4-dicyanatonaphthalene, 1,5-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene; 1,1,1-tris(4-cyanatophenyl)ethane, bis(4-cyanatophenyl) ether, 4,4'-(1,3-phenylenediisopropylidene)diphenyl cyanate, bis(4-cyanatophenyl) thioether, bis(4-cyanatophenyl) sulfone, tris(4-cyanatophenyl) phosphine, tris(4-cyanatophenyl) phosphate, phenol novolak type cyanates, cresol novolak type cyanates, dicyclopentadiene novolak type cyanates, phenyl aralkyl type cyanate esters, biphenyl aralkyl type cyanate esters, and naphthalene aralkyl type cyanate esters, which may be used alone or in admixture.

The cyanate ester compound may be obtained by reacting a phenol with cyanogen chloride under basic conditions. Depending on a particular application, an appropriate cyanate ester compound may be selected from a wide variety of compounds covering from solid one having a softening point of 106° C. to those which are liquid at normal temperature. For example, when it is desired to prepare a liquid resin composition, a cyanate ester compound which is liquid at normal temperature is used. When the epoxy resin composition is dissolved in a solvent to form a varnish, a choice may be made depending on solubility and solution viscosity. When a power semiconductor device is encapsulated with the resin composition by transfer molding, a cyanate ester compound which is solid at normal temperature is chosen.

Also, a cyanate ester compound having a low cyanato group equivalent, i.e., low molecular weight between functional groups undergoes less cure shrinkage, so that a cured product having low thermal expansion and a high glass transition temperature (Tg) is obtainable. On use of a cyanate ester compound having a high cyanato group equivalent, triazine crosslink spacing becomes flexible, despite a little drop of Tg, from which low modulus, high toughness, and low water absorption are expectable. The cyanate ester compound may have chlorine bonded thereto or left therein, preferably in a content of up to 50 ppm, more preferably up to 20 ppm. If the chlorine content exceeds 50 ppm, there is a possibility that when the cured composition is held at high temperature for a long time, chlorine or chloride ions are liberated via pyrolysis and cause corrosion to oxidized Cu frames, Cu wires or Ag plating, inviting separation of the cured composition or electric failures. Also chlorine may make the resin less insulating.

The cyanate ester compound (P) is preferably blended in an amount of 40 to 80 parts by weight, more preferably 50 to 76 parts by weight per 100 parts by weight of the total of resin components, i.e., components (P), (A) and (F).

(A) Silicone-Modified Epoxy Resin

Component (A) is a copolymer obtained from hydrosilylation reaction of an alkenyl-containing epoxy compound with a hydrogenorganopolysiloxane having the average compositional formula (1). The copolymer is effective for providing the resin composition of the second embodiment with a low modulus.

Although the detail of the silicone-modified epoxy resin (A) is the same as component (A) in the resin composition of the first embodiment, supplemental reference may be made to the following.

While the epoxy resin reacts with the cyanate ester compound to form an oxazole ring, the rate of this reaction is slow as compared with the triazine ring-forming reaction of cyanato groups. Notably a higher proportion of epoxy groups is detrimental to transfer molding because of a longer curing time. A tertiary amine such as triethylamine can be used herein, but at the sacrifice of shelf stability.

The epoxy resin (A) is blended in such an amount that an equivalent amount of epoxy groups is 0.04 to 0.30 mole per mole of cyanato groups in the cyanate ester compound (P). If the amount of the epoxy resin is below the range, a cured product of the resin composition of the second embodiment absorbs a more amount of moisture, with the risk of separation between the lead frame and the cured product in a hot humid environment. If the amount of the epoxy resin is beyond the range, the resin composition of the second embodiment under-cures so that the cured product may have a low Tg and lose hot-humid-storage stability.

(F) Phenol Compound and/or Silicone-Modified Phenolic Resin

In one embodiment, component (F) is a phenol compound having at least two phenolic hydroxyl groups per molecule. Any of well-known phenol compounds may be used as long as it has at least two phenolic hydroxyl groups per molecule. Typically the phenol compound has the general formula (3).

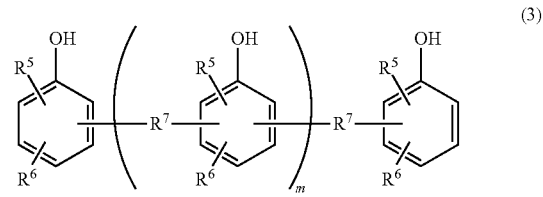

Herein $R^5$ and $R^6$ are each independently hydrogen or $C_1$-$C_4$ alkyl, $R^7$ is each independently a group selected from the following:

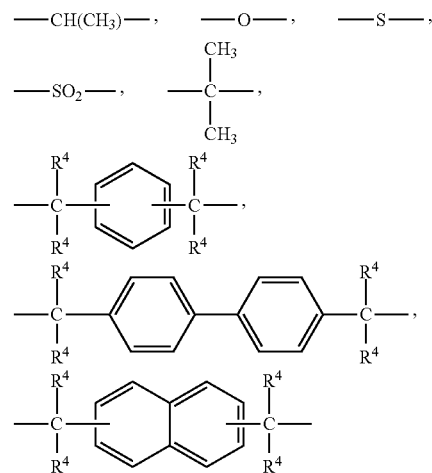

wherein $R^4$ is each independently hydrogen or methyl, and m is an integer of 0 to 10.

Examples of the phenol compound having formula (3) include bisphenol F type resins, bisphenol A type resins, phenol novolak resins, phenol aralkyl resins, biphenyl aralkyl resins, and naphthalene aralkyl resins, which may be used alone or in admixture.

In another embodiment, component (F) is a silicone-modified phenolic resin. It is a copolymer obtained from hydrosilylation reaction of an alkenyl-containing phenol compound with a hydrogenorganopolysiloxane having the average compositional formula (I). The copolymer is effective for providing the resin composition of the second embodiment with a low modulus.

Although the detail of the silicone-modified phenolic resin as component (F) is the same as component (B) in the resin composition of the first embodiment, supplemental reference may be made to the following.

In the prior art, metal salts and metal complexes are used as the curing catalyst for cyanate ester compounds (see JP-A S64-43527, JP-A H11-106480, JP-A 2005-506422). Specifically, salts and complexes of transition metals are used. The transition metals have a potential to promote oxidative degradation of organic resins at elevated temperature. In the resin composition of the second embodiment, the phenol compound functions as a catalyst for cyclization reaction of the cyanate ester compound. This eliminates a need for the metal salts and complexes, achieving an improvement in long-term storage stability at elevated temperature.

The phenol compound having at least two hydroxyl groups per molecule is expected to serve as a crosslinker for connecting triazine rings. Unlike epoxy compounds and amine compounds, the phenol compound bonds with the cyanate ester compound to form a structure: —C—O—Ar—. Since this structure is analogous to the triazine ring structure which is formed when the cyanate ester compound is cured alone, it is expected that the cured product is further improved in heat resistance.

It is noted that a phenol compound having a low hydroxyl equivalent, for example, a hydroxyl equivalent of up to 110 is highly reactive with cyanate groups. This means that when a composition is prepared by melt kneading components at a temperature of up to 120° C., curing reaction can take place to invite a substantial loss of flow, which is detrimental to transfer molding. It is thus desired that the phenol compound have a hydroxyl equivalent of at least 111.

The phenol compound is blended in such an amount that 0.08 to 0.30 mole of phenolic hydroxyl groups is available per mole of cyanato groups. If the amount of the phenol compound blended is below the range, reaction of cyanato groups is insufficient, with some cyanato groups being left unreacted. Residual cyanato groups are hydrolyzed in a humid atmosphere. This suggests that when the cured product is held in a hot humid environment, a lowering of mechanical strength and a loss of adhesion to the substrate can occur. If the amount of the phenol compound blended exceeds the range, curing reaction can take place at a lower temperature, which detracts from the flow and moldability of the resin composition.

Desirably the phenol compound has a content of halogen or alkali metal of up to 10 ppm, more desirably up to 5 ppm, when extracted at 120° C. and 2 atmospheres.

(E) Other Components

In addition to the essential components described above, the resin compositions of the first and second embodiments may further contain various additives such as cure accelerators, parting agents, flame retardants, ion trapping agents, antioxidants, and tackifiers, if necessary.

The cure accelerator is not particularly limited as long as it can accelerate curing reaction. Suitable cure accelerators include phosphorus compounds such as triphenylphosphine, tributylphosphine, tri(p-methylphenyl)phosphine, tri(p-nonylphenyl)phosphine, triphenylphosphine-triphenylboran, tetraphenylphosphine tetraphenylborate, tetraphenylphosphine tetra(p-methylphenyl)borate, and the adduct of triphenylphosphine and p-benzoquinone; tertiary amine compounds such as triethylamine, benzyldimethylamine, α-methylbenzyldimethylamine, and 1,8-diazabicyclo[5.4.0] undecene-7; and imidazole compounds such as 2-methylimidazole, 7-phenylimidazole, and 2-phenyl-4-methylimidazole, which may be used alone or in admixture. The cure accelerators may also be used in modified forms, for example, porous silica impregnated with the cure accelerator and the cure accelerator coated with a thermoplastic resin such as polymethyl methacrylate. Inter alfa, an imidazole compound having high basicity which is coated with a thermoplastic resin is preferred. The cure accelerator may be used in an effective amount, which is preferably 0.1 to 5 parts by weight, more preferably 0.5 to 2 parts by weight per 100 parts by weight of the total of essential components in each resin composition, but not limited thereto.

Any desired well-known parting agents may be used. Suitable parting agents include natural wax base parting agents such as carnauba wax, rice wax, candelilla wax; synthetic high molecular weight parting agents such as polyethylene, polyethylene oxide, polypropylene; fatty acid derivative base parting agents such as lauric acid, stearic acid, palmitic acid, behenic acid, cerotic acid, montanic acid, stearates, stearamides, ethylene bis(stearamide); and ethylene-vinyl acetate copolymers. The parting agents may be used alone or in admixture. The parting agent is preferably used in an amount of 0.5 to 5 parts by weight, more preferably 1 to 3 parts by weight per 100 parts by weight of the total of essential components in each resin composition.

Any desired well-known flame retardants may be used. Suitable flame retardants include phosphazene compounds, silicone compounds, zinc molybdate-carrying talc, zinc molybdate-carrying zinc oxide, aluminum hydroxide, magnesium hydroxide, molybdenum oxide, and antimony trioxide. The flame retardant is preferably used in an amount of 2 to 20 parts by weight, more preferably 3 to 10 parts by weight per 100 parts by weight of the total of essential components in each resin composition.

Any desired well-known ion trapping agents may be used. Suitable ion trapping agents include hydrotalcites, bismuth hydroxide, and rare earth oxides. The ion trapping agent is preferably used in an amount of 1 to 10 parts by weight, more preferably 1.5 to 5 parts by weight per 100 parts by weight of the total of essential components in each resin composition.

Any desired well-known tackifiers may be used. For example, coupling agents as used for the surface treatment of inorganic fillers may be used as the tackifier. The tackifier may be used alone or in admixture. The tackifier is preferably used in an amount of 0.2 to 5 parts by weight, more preferably 0.5 to 3 parts by weight per 100 parts by weight of the total of essential components in each resin composition.

The resin compositions of the first and second embodiments may be prepared by any desired methods. For example, the resin composition may be obtained by stirring, dissolving, mixing and dispersing essential components simultaneously or separately, while heat treating if necessary, and in some cases, by further adding optional components to the mixture, mixing, stirring and dispersing them. Although the machine used in the mixing step is not particularly limited, suitable machines include an automated mortar, two-roll mill, three-roll mill, ball mill, continuous extruder, planetary mixer, and MassColloider, equipped with stirring and heating units. These machines may be used in a suitable combination if desired.

The resin compositions of the first and second embodiments are useful as an encapsulant for semiconductor devices including transistor, module, DIP, SO, flat pack and ball grid array type devices. The method for encapsulating a semiconductor device with the resin composition is not particularly limited, and any of prior art molding methods such as transfer molding, injection molding and casting may be used. The resin composition is preferably molded under suitable conditions, typically at 160 to 190° C. for 45 to 300 seconds and post-cured at 170 to 250° C. for 2 to 16 hours.

EXAMPLE

Examples of the invention are given below by way of illustration and not by way of limitation.

Resin Composition of First Embodiment

Examples 1 to 3

Resin compositions were prepared by combining components (A) and (B) synthesized in Synthesis Examples 1 to 5 and the components shown below in accordance with the formulation described in Table 1, melt mixing them on a hot two-roll mill until uniform, cooling and grinding.

(A) Silicone-Modified Epoxy Resins E-01, E-02, E-03

Synthesis Example 1

A 1-L separable flask was charged with 0.16 g of a 0.5 wt % chloroplatinic acid toluene solution, 80 g of toluene, and 323 g of monoallyldiglycidylisocyanuric acid (MA-DGIC by Shikoku Chemicals Corp.), followed by stirring and heating at an internal temperature of 80° C. Thereafter, 81 g of 1,1,3,3-tetramethyldisiloxane (Shin-Etsu Chemical Co., Ltd.) was added dropwise over 30 minutes, and reaction run at 90° C. for 4 hours. The resulting toluene solution was distilled under reduced pressure, obtaining a silicone-modified epoxy resin E-01 having a structure of the formula (4) shown below. The resin E-01 had an epoxy equivalent of 169 g/eq.

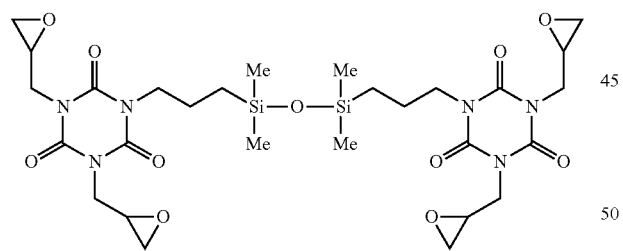

(4)

Synthesis Example 2

A 1-L separable flask was charged with 0.16 g of a 0.5 wt % chloroplatinic acid toluene solution, 80 g of toluene, and 296 g of o-allylphenyl glycidyl ether (OAP-EP by Shikoku Chemicals Corp.), followed by stirring and heating at an internal temperature of 80° C. Thereafter, 110 g of 1,1,3,3-tetramethyldisiloxane (Shin-Etsu Chemical Co., Ltd.) was added dropwise over 30 minutes, and reaction run at 90° C. for 4 hours. The resulting toluene solution was distilled under reduced pressure, obtaining a silicone-modified epoxy resin E-02 having a structure of the formula (5) shown below. The resin E-02 had an epoxy equivalent of 257 g/eq.

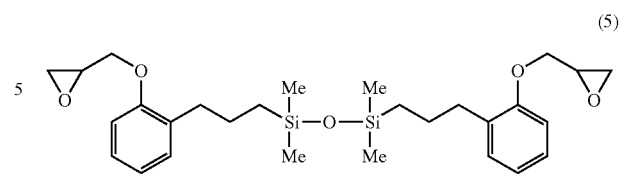

(5)

Synthesis Example 3

A 2-L separable flask was charged with 1.68 g of a 0.5 wt % chloroplatinic acid toluene solution, 200 g of toluene, and 596.06 g (2.4 mol) of 1,2-epoxy-4-vinylcyclohexane, followed by stirring and heating at an internal temperature of 80° C. Thereafter, 240.51 g (1 mol) of 2,4,6,8-tetramethylcyclotetrasiloxane was added dropwise over 1 hour, and reaction run at 100° C. for 2 hours. The resulting toluene solution was distilled under reduced pressure, obtaining a silicone-modified epoxy resin E-03 having a structure of the formula (6) shown below. The resin E-03 had an epoxy equivalent of 200 g/eq.

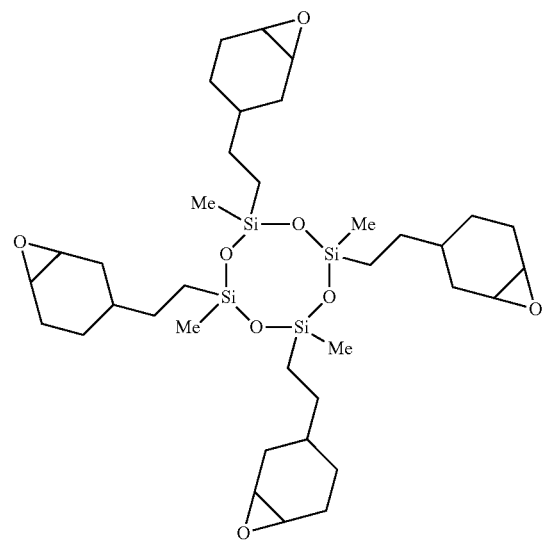

(6)

(B) Silicone-Modified Phenolic Resins P-01, P-02

Synthesis Example 4

A 1-L separable flask was charged with 0.16 g of a 0.5 wt % chloroplatinic acid toluene solution, 80 g of toluene, and 263 g of 2-allylphenol (Yokkaichi Chemical Co., Ltd.), followed by stirring and heating at an internal temperature of 80° C. Thereafter, 124 g of 2,4,6,8-tetramethyleyclotetrasiloxane (KF-9902 by Shin-Etsu Chemical Co., Ltd.) was added dropwise over 30 minutes, and reaction run at 90° C. for 3 hours. The resulting toluene solution was distilled under reduced pressure, obtaining a silicone-modified phenolic resin P-01 having a structure of the formula (7) shown below. The resin P-01 had a hydroxyl equivalent of 194 g/eq.

(7)

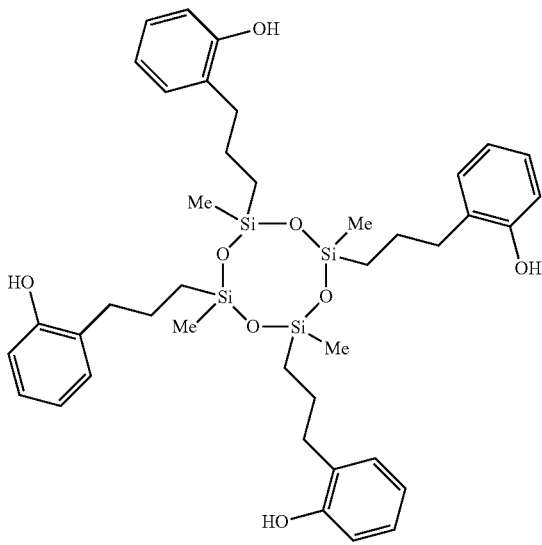

Synthesis Example 5

A 1-L separable flask was charged with 0.16 g of a 0.5 wt % chloroplatinic acid toluene solution, 80 g of toluene, and 266 g of 2-allylphenol (Yokkaichi Chemical Co., Ltd.), followed by stirring and heating at an internal temperature of 80° C. Thereafter, 140 g of 1,1,3,3-tetramethyldisiloxane (HM-H by Shin-Etsu Chemical Co., Ltd.) was added dropwise over 30 minutes, and reaction run at 90° C. for 3 hours. The resulting toluene solution was distilled under reduced pressure, obtaining a silicone-modified phenolic resin P-02 having a structure of the formula (8) shown below. The resin P-02 had a hydroxyl equivalent of 201 g/eq.

(8)

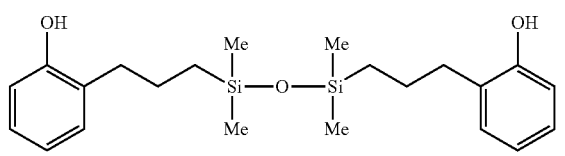

(C) Black Pigment
carbon black (3230MJ by Mitsubishi Chemical Corp.)
(D) Inorganic Filler
fused silica powder (average particle size 16 μm, by Tatsumori Ltd.)
(E) Other Components
Cure Accelerator
triphenyl phosphine (TPP® by Hokkou Chemical Co., Ltd.)
2-ethyl-4-methylimidazole (Curezol® 2E4MZ by Shikoku Chemicals Corp.)
Other Additives
carnauba wax (TOWAX-131 by Toa Kasei Co., Ltd.)
Silane coupling agent which is a 1:5 mixture of 3-mercaptopropyltrimethoxysilane (KBM-803 by Shin-Etsu Chemical Co., Ltd.) and 3-glycidoxypropyltrimethoxysilane (KBM-403 by Shin-Etsu Chemical Co., Ltd.)

Comparative Examples 1 to 3

Resin compositions were prepared by combining the components used in Examples 1 to 3 and the epoxy resin and phenolic resin shown below in accordance with the formulation described in Table 1, melt mixing them on a hot two-roll mill until uniform, cooling and grinding.
Epoxy Resin
polyfunctional epoxy resin (EPPN-501H by Nippon Kayaku Co., Ltd.)
Phenolic Resin
phenol novolak resin (TD-2131 by DIC Corp.)
The thus obtained resin compositions were evaluated by the following tests.
[Tests]
Tracking Resistance
The resin composition was molded into a specimen of 50 mm diameter×3 mm thick according to JIS C 2134: 2007 and post cured at 180° C. for 4 hours. The specimen was held in a 25° C./50% RH atmosphere for 48 hours.
Two platinum electrodes were placed in contact with the surface of the specimen. While a voltage was applied between the electrodes, a 0.1 wt % ammonium chloride aqueous solution was dropped on the specimen at intervals of one droplet every 30 seconds. The test used five specimens (N=5). The value of maximum voltage against which the specimen resisted without tracking breakdown or sustaining flame during the measurement period of 50 droplets was determined as comparative tracking index (CTI). With the fixed voltage of 600 V applied, the resin composition was evaluated for tracking resistance by counting the number of droplets of 0.1 wt % ammonium chloride aqueous solution.

TABLE 1

| Formulation (parts by weight) | | | Example | | | Comparative Example | | |
|---|---|---|---|---|---|---|---|---|
| | | | 1 | 2 | 3 | 1 | 2 | 3 |
| (A) | Silicone-modified epoxy resin | E-01 | 46.6 | | | | 60.6 | |
| | | E-02 | | 57.3 | | | | |
| | | E-03 | | | 50.2 | | | |
| | Epoxy resin | polyfunctional epoxy resin | | | | 60.0 | | 46.0 |
| (B) | Silicone-modified phenolic resin | P-01 | 53.4 | | 49.8 | | | 54.0 |
| | | P-02 | | 42.7 | | | | |
| | Phenolic resin | phenol novolak resin | | | | 40.0 | 39.4 | |
| (C) | Black pigment | carbon black | 1.5 | 1.5 | 1.5 | 1.5 | 1.5 | 1.5 |
| (D) | Inorganic filler | fused silica powder | 430 | 430 | 430 | 430 | 430 | 430 |
| (E) | Other additives | triphenylphosphine | | | 1.0 | 1.0 | | |
| | | 2-ethyl-4-methylimidazole | 1.0 | 1.0 | | | 1.0 | 1.0 |
| | | carnauba wax | 1.5 | 1.5 | 1.5 | 1.5 | 1.5 | 1.5 |
| | | silane coupling agent | 1.2 | 1.2 | 1.2 | 1.2 | 1.2 | 1.2 |

TABLE 1-continued

|  |  |  | Example | | | Comparative Example | | |
| --- | --- | --- | --- | --- | --- | --- | --- | --- |
| Formulation (parts by weight) | | | 1 | 2 | 3 | 1 | 2 | 3 |
| Test | Tracking resistance | CTI, droplet count @600 V (droplets) | >50 | >50 | >50 | 12 | 8 | 17 |

The data in Table 1 demonstrate that the resin compositions of Examples 1 to 3 have improved tracking resistance.

Resin Composition of Second Embodiment

Examples 4 to 7

Thermosetting resin compositions were prepared by combining components (P), (A) and (F) and other components shown below in accordance with the formulation described in Table 2, and melt mixing them at 100° C. for 3 minutes until uniform.

(P) Cyanate Ester Compound

A cyanate ester compound (Primaset® PT-60 by Lonza Ltd., cyanato equivalent 119) having the following formula (9)

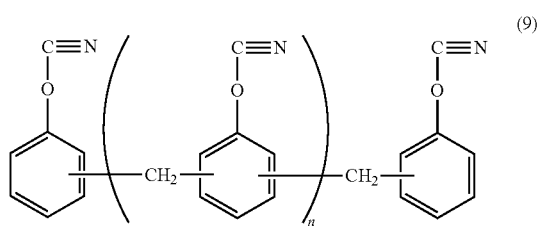

(9)

It is a mixture of compounds having formula (9) wherein n is from 0 to 10.

(A) Silicone-Modified Epoxy Resins E-01, E-02, E-04

Silicone-modified epoxy resins E-01 and E-02 are identical with silicone-modified epoxy resins E-01 and E-02 used in the resin compositions of the first embodiment. Silicone-modified epoxy resin E-04 was synthesized in Synthesis Example 6.

Synthesis Example 6

A 1-L separable flask was charged with 0.16 g of a 0.5 wt % chloroplatinic acid toluene solution, 80 g of toluene, and 272 g of 1,2-epoxy-4-vinylcyclohexane (Daicel Corp.), followed by stirring and heating at an internal temperature of 60° C. Thereafter, 141 g of 1,1,3,3-tetramethyldisiloxane (Shin-Etsu Chemical Co., Ltd.) was added dropwise over 30 minutes, and reaction run at 60° C. for 1 hour. The resulting toluene solution was distilled under reduced pressure, obtaining a silicone-modified epoxy resin E-04 having a structure of the formula (10) shown below. The resin E-04 had an epoxy equivalent of 257 g/eq.

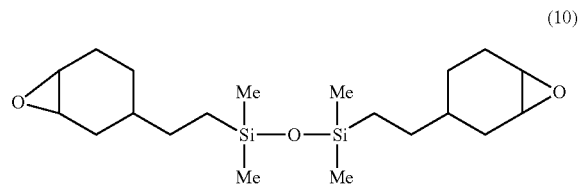 [SMILES: C[Si](C)(CCC1CCC2OC2C1)O[Si](C)(C)CCC1CCC2OC2C1]

(10)

Silicone-Modified Phenolic Resins P-01, P-02

These are identical with silicone-modified phenolic resins P-01 and P-02 used in the resin compositions of the first embodiment.

(F) Phenolic Resin

A phenol compound (MEH-7851SS by Meiwa Plastic Industries, Ltd., phenolic hydroxyl equivalent 203) having the following formula (11)

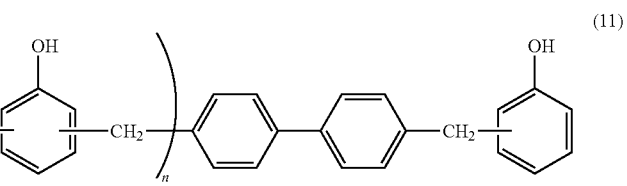

(11)

It is a mixture of compounds having formula (11) wherein n is from 0 to 10.

Comparative Examples 4 and 5

Thermosetting resin compositions were prepared by combining the components used in Examples 4 to 7 and additional component shown below in accordance with the formulation described in Table 2, and melt mixing them at 100° C. for 3 minutes until uniform.

(A) Epoxy Resin

An epoxy resin compound (NC-3000 by Nippon Kayaku Co., Ltd., epoxy equivalent 272) having the following formula (12)

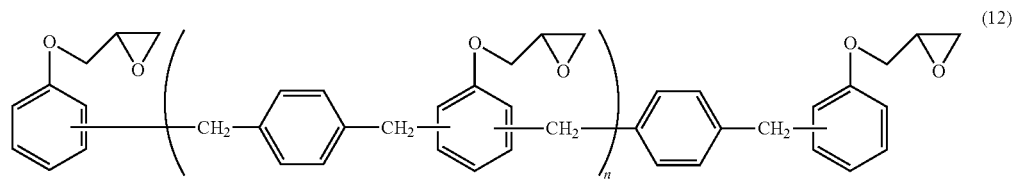

It is a mixture of compounds having formula (12) wherein n is from 0 to 10.

[Tests]

Preparation of Cured Sample

Specimens of Examples 4 to 7 and Comparative Examples 4, 5 were prepared as follows. The thermosetting epoxy resin composition was heat cured at 150° C. for 1 hour and then at 180° C. for 4 hours into a specimen, which was subject to the following tests.

Measurement of Tg

Each of the cured products of Examples 4 to 7 and Comparative Examples 4, 5 was worked into a specimen of 5×5×15 mm. The specimen was set on a thermomechanical analyzer TMA8310 (Rigaku Corp.). A change of a dimension of the specimen was measured during the heating program from 25° C. to 300° C. at a heating rate of 5° C./min. A dimensional change was plotted relative to temperature in the graph of FIG. 1. From the graph showing dimensional change to temperature relationship, the glass transition temperature (Tg) of the resin compositions of Examples 4 to 7 and Comparative Examples 4, 5 was determined by the Tg determining method described below.

Tg Determining Method

In the graph of FIGS. 1, T1 and T2 are two arbitrary temperatures at which tangents to the dimensional change/temperature curve are available, below the temperature of inflection point, and T1' and T2' are two arbitrary temperatures at which tangents to the dimensional change/temperature curve are available, above the temperature of inflection point. D1 and D2 are dimensional changes at T1 and T2. D1' and D2' are dimensional changes at T1' and T2'. Tg is given by the point of intersection between a straight line connecting point (T1, D1) and point (T2, D2) and a straight line connecting point (T1', D1') and point (T2', D2').

Flexural Strength and Flexural Modulus

A specimen of 100×10×4 mm was prepared according to JIS K 6911:2006. The specimen was measured for flexural strength and flexural modulus at room temperature (25° C.) by using an autograph tester (Shimadzu Corp.) and bending the specimen at three points.

TABLE 2

| | | | Example | | | | Comparative Example | |
|---|---|---|---|---|---|---|---|---|
| | Formulation (parts by weight) | | 4 | 5 | 6 | 7 | 4 | 5 |
| (P) | Cyanate ester compound | PT-60 | 60.0 | 60.0 | 60.0 | 60.0 | 60.0 | 60.0 |
| (A) | Silicone-modified | E-01 | 24.1 | | | | | 12.5 |
| | epoxy resin | E-02 | | | 23.3 | | | |
| | | E-04 | | 23.5 | | 23.3 | | |
| | Epoxy resin | NC-3000 | | | | | 22.9 | 7.1 |
| (F) | Silicone-modified | P-01 | 15.9 | | | | | |
| | phenolic resin | P-02 | | 16.5 | | | | |
| | Phenolic resin | MEH-7851SS | | | 16.7 | 16.7 | 17.1 | 20.4 |
| Molar ratio of phenolic hydroxyl group/cyanate group | | | 0.163 | 0.163 | 0.163 | 0.163 | 0.167 | 0.199 |
| Molar ratio of epoxy group/cyanate group | | | 0.283 | 0.233 | 0.171 | 0.231 | 0.167 | 0.198 |
| Tests | Tg (° C.) | | 200 | 201 | 243 | 199 | 194 | 194 |
| | Flexural strength (MPa) | | 31 | 32 | 35 | 46 | 36 | 36 |
| | Flexural modulus (MPa) | | 2280 | 1530 | 2020 | 2110 | 2700 | 2520 |

The data in Table 2 demonstrate that the resin compositions of Examples 4 to 7 have a reduced modulus and mitigate the risk of cracking or separation while maintaining thermal stability.

Japanese Patent Application Nos. 2017-099972 and 2017-100000 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone-modified epoxy resin composition comprising:

(A) a silicone-modified epoxy resin obtained from hydrosilylation reaction of an alkenyl-containing epoxy compound with an organopolysiloxane having the average compositional formula (1):

wherein R is each independently a $C_1$-$C_{10}$ monovalent hydrocarbon group, a is a positive number: $0.01 \leq a \leq 1$, b is a positive number: $1 \leq b \leq 3$, and $1.01 \leq a+b < 4$, (B) a silicone-modified phenolic resin obtained from hydrosilylation reaction of an alkenyl-containing phenol compound with an organopolysiloxane having the average compositional formula (1), (C) a black pigment, and (D) an inorganic filler exclusive of the black pigment (C), wherein the silicone-modified epoxy resin of component (A) has the following formula (5):

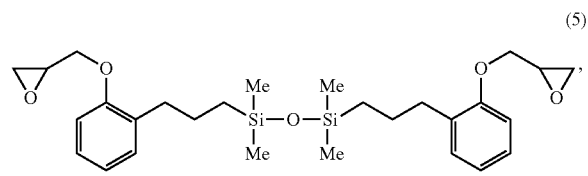 [SMILES: C[Si](C)(CCCc1ccccc1OCC1CO1)O[Si](C)(C)CCCc1ccccc1OCC1CO1]

and wherein the silicone-modified phenolic resin of component (B) has the following formula (7)

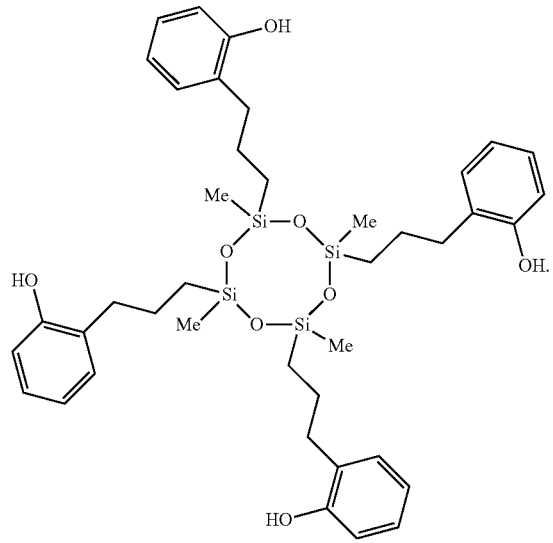

2. The silicone-modified epoxy resin composition of claim 1 wherein the inorganic filler (D) is present in an amount of 150 to 1,500 parts by weight per 100 parts by weight of components (A) and (B) combined and 60 to 94% by weight of the total weight of the composition.

3. A semiconductor device encapsulated with a cured product of the silicone-modified epoxy resin composition of claim 1.

* * * * *